(12) United States Patent
Blackall et al.

(10) Patent No.: US 7,532,041 B2
(45) Date of Patent: May 12, 2009

(54) SYSTEMS AND METHODS FOR HYSTERESIS CONTROL IN A COMPARATOR

(75) Inventors: Eric C. Blackall, Richardson, TX (US); Mohammad Al-Shyoukh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 51 days.

(21) Appl. No.: 11/613,344

(22) Filed: Dec. 20, 2006

(65) Prior Publication Data

US 2008/0150589 A1    Jun. 26, 2008

(51) Int. Cl.
*H03K 5/22* (2006.01)

(52) U.S. Cl. .............................. 327/67; 327/71; 327/206

(58) Field of Classification Search .................. 327/205, 327/206, 65–71
See application file for complete search history.

(56) References Cited

U.S. PATENT DOCUMENTS

| | | | | |
|---|---|---|---|---|
| 4,670,671 A | * | 6/1987 | De Weck | 327/66 |
| 4,775,807 A | * | 10/1988 | Bukowski, Jr. | 327/72 |
| 5,039,888 A | * | 8/1991 | Bell et al. | 327/73 |
| 5,266,884 A | * | 11/1993 | Agiman | 323/284 |
| 5,426,386 A | * | 6/1995 | Matthews et al. | 327/63 |
| 5,446,396 A | * | 8/1995 | Brehmer | 327/66 |
| 5,528,185 A | * | 6/1996 | Lewicki et al. | 327/206 |
| 5,801,553 A | * | 9/1998 | Danstrom | 327/67 |
| 5,894,234 A | * | 4/1999 | Morris | 327/65 |
| 6,087,873 A | * | 7/2000 | Alexander | 327/206 |
| 6,229,350 B1 | * | 5/2001 | Ricon-Mora | 327/77 |
| 6,982,582 B1 | * | 1/2006 | Cheng | 327/205 |

* cited by examiner

*Primary Examiner*—Lincoln Donovan
*Assistant Examiner*—William Hernandez
(74) *Attorney, Agent, or Firm*—William B. Kempler; W. James Brady; Frederick J. Telecky, Jr.

(57) ABSTRACT

Various systems and methods for comparing signals are disclosed herein. For example, some embodiments of the present invention provide comparator circuits with programmable hysteresis. Such circuits include a comparator input circuit that receives two inputs to be compared. The comparator input circuit provides a first differential current output based at least in part on a difference between the first voltage input and the second voltage input. The aforementioned circuits further include a hysteresis control circuit that is operable to receive a single programmable voltage input, and to provide a second differential current output based at least in part on the comparator output and the single programmable voltage input. An output circuit is also included that sums the first differential current and the second differential current, and provides a comparator output based at least in part on the sum of the first differential current and the second differential current.

19 Claims, 4 Drawing Sheets

SYSTEMS AND METHODS FOR HYSTERESIS CONTROL IN A COMPARATOR

BACKGROUND OF THE INVENTION

The present invention is related to comparators, and more particularly to comparators that are programmable to reduce oscillation.

Various comparators have been developed that allow for comparing two input signals and providing an output signal indicating the result of the comparison. In some cases, the two compared signals vary around voltages near one another. For example, two comparator inputs may exhibit an overall variance of between zero and three volts and have substantial separation between the voltages of the inputs. However, for extended periods of time the same two comparator inputs may each vary between 0.2 and 0.3 volts with one of the inputs being higher than the other at one time and lower than the other at another time. In such a situation, the switch from one input being higher than other to being lower than the other may be due more to noise than any substantial change. In such a case, the output of the comparator may oscillate as the comparator inputs change relative to one another due to noise. This scenario may result in one or more errors such as, for example, false comparator readings.

Hence, for at least the aforementioned reasons, there exists a need in the art for advanced systems and methods for implementing comparators.

BRIEF SUMMARY OF THE INVENTION

The present invention is related to comparators, and more particularly to comparators that are programmable to reduce oscillation.

Some embodiments of the present invention provide comparator circuits with programmable hysteresis. Such circuits include a comparator input circuit that receives two voltage inputs to be compared. The comparator input circuit provides a first differential current output based at least in part on a difference between the first voltage input and the second voltage input. The aforementioned circuits further include a hysteresis control circuit that is operable to receive a single programmable voltage input, and to provide a second differential current output based at least in part on the comparator output and the single programmable voltage input. An output circuit is also included that sums the first differential current and the second differential current, and provides the comparator output based at least in part on the sum of the first differential current and the second differential current. In some cases, the single programmable voltage input is referenced to a Kelvin connected ground on the same substrate as the hysteresis control circuit.

In some instances of the aforementioned embodiments, the circuits further include a trim control circuit that is operable to receive a programmable trim input, and to provide a third differential current output based at least in part on the programmable trim input. In such cases, the output circuit is further operable to sum the third differential current with the first differential current and the second differential current. The comparator output in such cases is based at least in part on the sum of the aforementioned three differential currents. The output circuit may further include a digital comparator circuit with at least two inputs. The sum of the first leg of the first differential current, the first leg of the second differential current, and the first leg of the third differential current are received at one of the inputs; and the sum of the second leg of the first differential current, the second leg of the second differential current, and the second leg of the third differential current is received at the other input. Based on a comparison of the aforementioned current sums, the digital comparator provides a comparator output.

In some cases, the comparator input circuit includes a first P-type transistor and a second P-type transistor. The source of the first P-type transistor is electrically coupled to the source of the second P-type transistor, the gate of the first P-type transistor is electrically coupled to the first voltage input, and the gate of the second P-type transistor is electrically coupled to the second voltage input. In some cases, the hysteresis control circuit includes: a first transistor chain and a second transistor chain. The first transistor chain includes a first N-type transistor and a second N-type transistor. The drain of the first N-type transistor is electrically coupled to a Kelvin connected ground, the source of the first N-type transistor is electrically coupled to the drain of the second N-type transistor, the source of the second N-type transistor is electrically coupled to the single programmable voltage input, and a first output node is electrically coupled to the source of the first N-type transistor and the drain of the second N-type transistor. The second transistor chain includes a third N-type transistor and a fourth N-type transistor. The drain of the third N-type transistor is electrically coupled to the Kelvin connected ground, the source of the third N-type transistor is electrically coupled to the drain of the fourth N-type transistor, the source of the fourth N-type transistor is electrically coupled to the single programmable voltage input, and a second output node is electrically coupled to the source of the third N-type transistor and the drain of the fourth N-type transistor. The gate of the first N-type transistor and the gate of the fourth N-type transistor are electrically coupled to the comparator output, and the gate of the second N-type transistor and the gate of the third N-type transistor are electrically coupled to an inverted version of the comparator output. Further, a third P-type transistor and a fourth P-type transistor are included in the hysteresis control circuit. The source of the third P-type transistor is electrically coupled to the source of the fourth P-type transistor, the gate of the third P-type transistor is electrically coupled to the first output node, and the gate of the fourth P-type transistor is electrically coupled to the second output node.

In such cases, the drain of the first P-type transistor provides a first leg of the first differential current, and the drain of the second P-type transistor provides a second leg of the first differential current. Similarly, the drain of the third P-type transistor provides a first leg of the second differential current, and the drain of the fourth P-type transistor provides a second leg of the second differential current. Summing the first differential current and the second differential current includes electrically coupling the first leg of the first differential current to the first leg of the second differential current, and electrically coupling the second leg of the first differential current to the second leg of the second differential current.

Other embodiments of the present invention provide methods for reducing oscillation in a comparator. The methods include providing a comparator with a hysteresis control circuit. The hysteresis control circuit is programmed via a single programmable voltage input. The methods further include applying a first voltage to the first voltage input and a second voltage to the second voltage input, and applying a third voltage to the single programmable voltage input. In the first instance, the first voltage is greater than the second voltage by at least a second amount. In a first step, the first voltage is modified in relation to the second voltage such that the first voltage becomes less than the second voltage by a first amount. In such a case, the comparator output does not change as the first amount is insufficient to overcome hysteresis corresponding to the third voltage. In a second step, the first voltage is modified in relation to the second voltage such that the first voltage becomes less than the second voltage by the second amount. In this case, the comparator output changes as the second amount is sufficient to overcome hysteresis corresponding to the third voltage. In a third step, the first voltage is modified in relation to the second voltage such that the first voltage becomes greater than the second voltage by the first amount. In such a case, the comparator output does not change. In a fourth step, the first voltage is modified in relation to the second voltage such that the first voltage becomes greater than the second voltage by the second amount. In this case, the comparator output does change as the hysteresis offset is overcome.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by referenced to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to comparators, and more particularly to comparators that are programmable to reduce oscillation.

Figure 1:
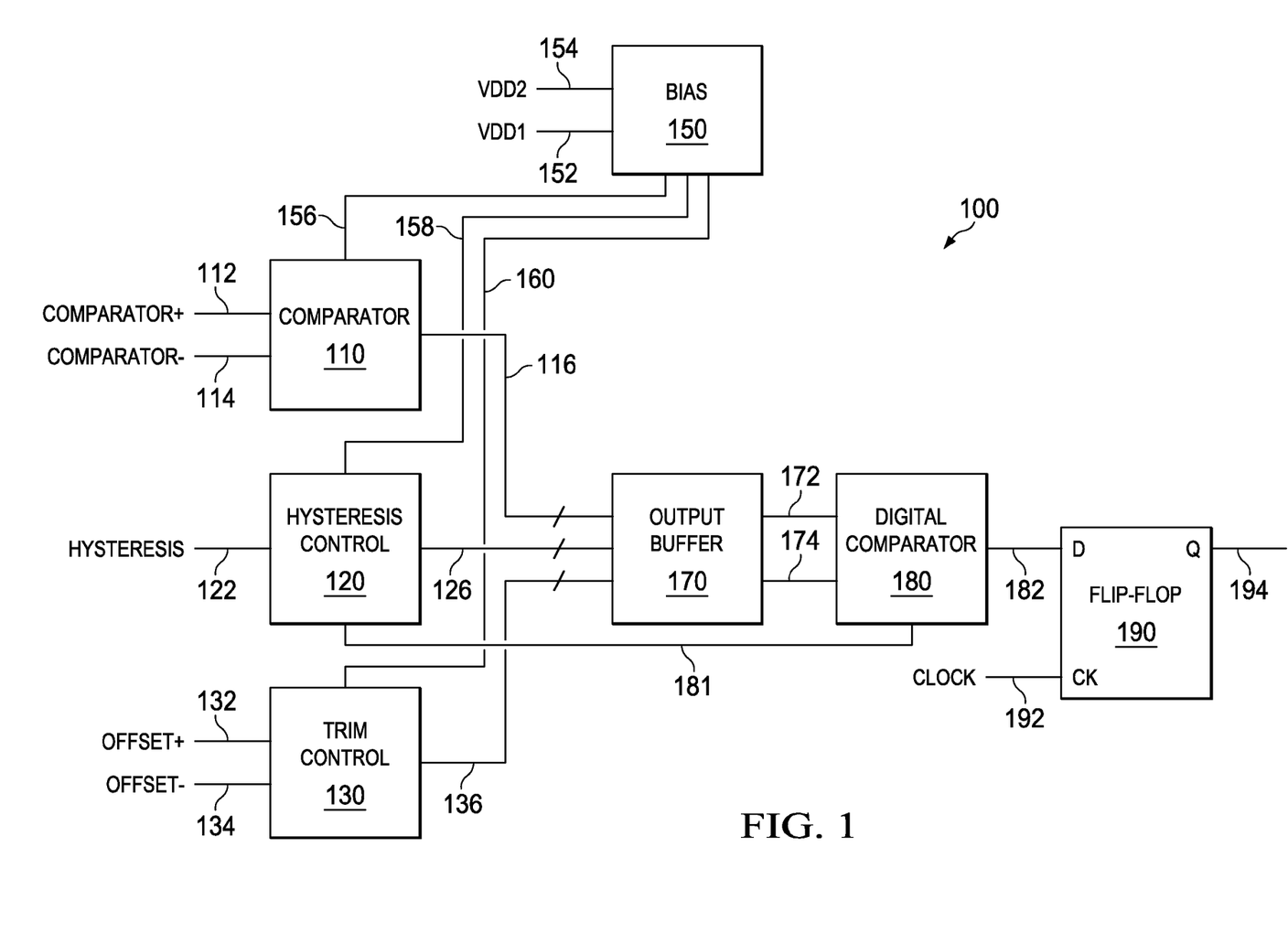
FIG. 1 is a block diagram of single input hysteresis controlled comparator in accordance with one or more embodiments of the present invention.

Turning to FIG. 1, a block diagram of a comparator 100 in accordance with one or more embodiments of the present invention is depicted. Comparator 100 includes a bias circuit 150, comparator input circuit 110, a hysteresis control circuit 120, a trim control circuit 130, an output buffer 170, a digital comparator 180, and an output latch 190. Bias circuit 150 provides bias currents used by other circuits in comparator 100, and is in part responsible for defining the operating range of comparator 100. In some cases, bias circuit 150 receives a voltage input VDD1 152 and a voltage input VDD2 154. VDD1 152 may be the voltage level used to drive the various circuitry of comparator 100, while VDD2 152 may be received from a higher voltage source that is used to allow comparator 100 to operate across a voltage range that is higher than that supported by VDD1 152 alone. As shown, bias circuit 150 provides a current output 156 to comparator input circuit 110, a current output 158 to hysteresis control circuit 120, and a current output 160 to trim control circuit 130.

Comparator input circuit 110 receives two voltage inputs 112, 114 (i.e., Comparator– and Comparator+), and provides a differential current output 116 that is proportional to the difference between voltage inputs 112, 114. Differential current output 116 is provided to output buffer 170. Hysteresis control circuit 120 receives a single voltage input 122 and a status 181 of digital comparator 180. Hysteresis control circuit 120 provides a differential current output 126 that reflects voltage input 122 and the status of digital comparator 180. More particularly, differential current output 126 from hysteresis control circuit 120 operates as a switching offset to output buffer 170. The switching offset limits any oscillation in an output 182 of digital comparator 180 when input voltages 112, 114 are not varying substantially relative to one another. Trim control circuit 130 receives two voltage inputs 132, 134 (i.e., Offset+ and Offset–). Based on voltage inputs 132, 134, trim control circuit 130 provides a differential output current 136. Differential output current 136 offsets any mismatch between components in comparator 100 and/or any voltage bias introduced by bias circuit 150.

Output buffer 170 sums differential current output 116 with differential current output 126 and differential current output 136. Based on the sum of the aforementioned three differential currents, a voltage output 172 and a voltage output 174 are provided to digital comparator 180. Digital comparator 180 compares the voltage output 172 with voltage output 174 and provides a comparator output 182 that is indicative of the aforementioned comparison. For example, where voltage output 172 is greater than voltage output 174, comparator output 182 is asserted low. Alternatively, where voltage output 172 is less than voltage output 174, comparator output 182 is asserted high. Additionally, digital comparator 180 provides status 181. In some cases, status 181 is a two signal bus with one of the signals being comparator output 182, and the other signal being the inverse of output 182. Again, status 181 is provided to hysteresis control circuit 120. Based in part on status 181, hysteresis control circuit 120 assures that a programmable voltage threshold is satisfied before comparator output 182 of digital comparator 180 will switch. A latch device 190 receives comparator output 182 and latches it on a rising or falling edge of a clock 192. As shown, latch device 190 is a flip-flop, however, one of ordinary skill in the art will recognize other devices that are capable of receiving comparator output 182 and latching it or otherwise registering it synchronous to clock 192.

Figure 2:
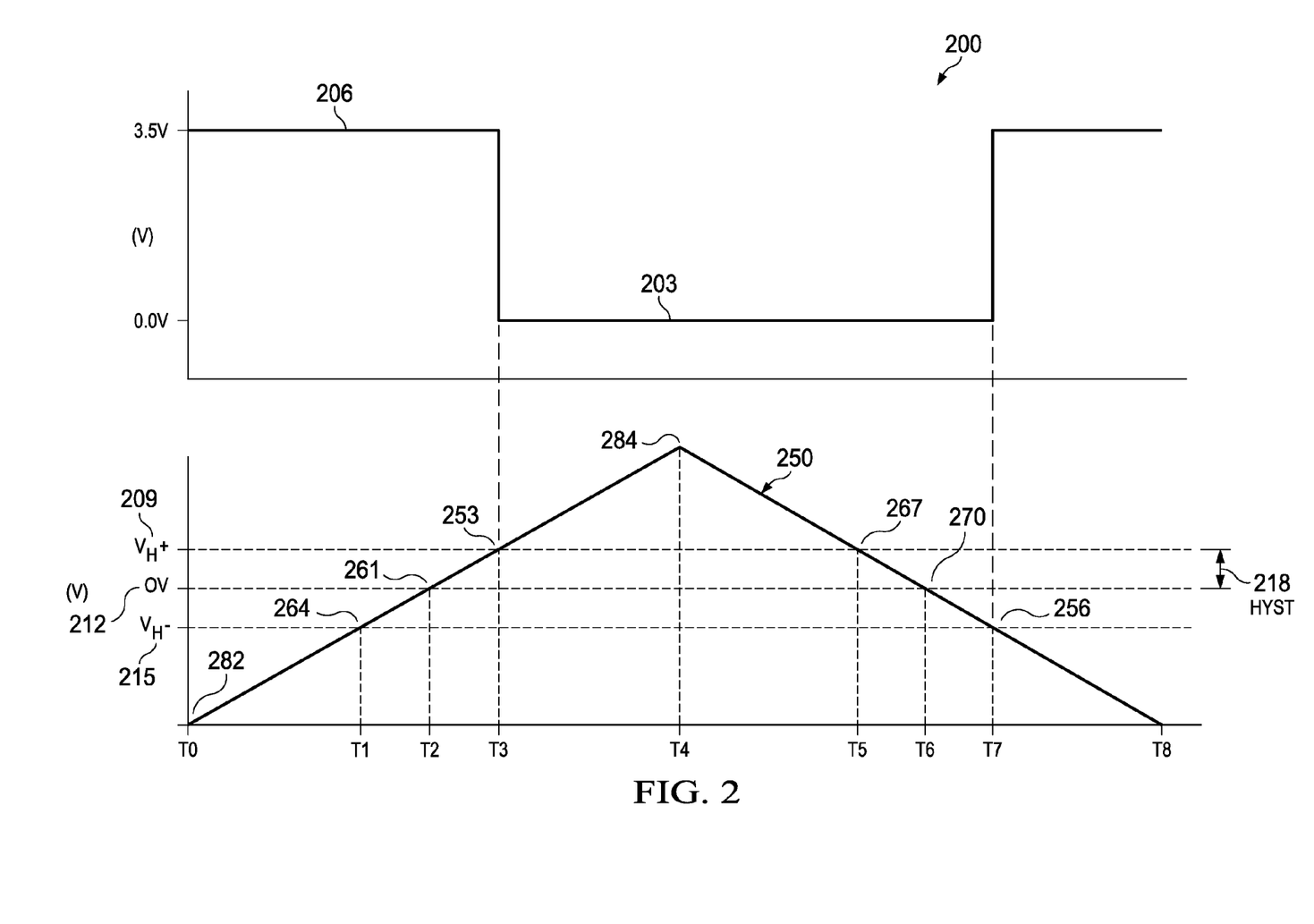
FIG. 2 is timing diagram showing an exemplary output of the single input hysteresis controlled comparator of FIG. 1 as a function of an exemplary input.

Turning to FIG. 2, the operation of comparator 100 is shown in relation to a timing diagram 200 plotting voltage on the y-axis as a function of time along the x-axis. In particular, diagram shows a plot 250 of the difference between input 112 and input 114 of comparator 100. As shown, plot 250 increases from a voltage minimum 282 to a voltage maximum 284 during a time T0 to a time T4, and decreases from voltage maximum 284 during time T4 to a time T8. At time T1, plot 250 passes a point 264 associated with a low end 215 of a hysteresis band. At time T2, plot 250 passes a point 261 associated with a zero difference 212 between input 112 and input 114. At time T3, plot 250 passes a point 253 associated with an upper end 209 of the hysteresis band. A time T5, plot 250 passes a point 267 again associated with upper end 209 of the hysteresis band. At time T6, plot 250 continues past a point 270 associated with a zero difference 212, and at time T7, plot 250 passes a point 256 associated with lower end 215 of the hysteresis band.

The state of comparator output 182 is shown across the same time scale as that used for plot 250. As shown, at time T0, the difference between input 112 and input 114 is significant (i.e., Vmin 282), and causes comparator output 182 to be asserted high (i.e., at a voltage level 206). Comparator output 182 remains asserted high even though there is a change in the polarity of the difference between input 112 and input 114 (i.e., between time T2 and time T3). This is due to the hysteresis programmed into comparator 100 via voltage input 122. The hysteresis band increases in size when the voltage on input 122 is increased, and decreases when the voltage on input 122 decreases. Said another way, the magnitude of HYST 218 is proportional to the magnitude of the voltage on input 122.

As the difference between input 112 and input 114 exceeds upper end 209 of the hysteresis band (i.e., the difference between input 112 and input 114 exceeds HYST 218), comparator output 182 is asserted low (i.e., at a voltage level 203). Comparator output 182 remains asserted low for the period between time T3 and time T7 even though there is a change in the polarity of the difference between input 112 and input 114 (i.e., between time T6 and time T7). Again, comparator output 182 remains constant until the difference between input 112 and input 114 exceeds that of the lower hysteresis level (i.e., low end 215) of the hysteresis band. Once low end 215 of the hysteresis band has been exceeded, comparator output 182 switches back to the high assertion level. By eliminating the ability for comparator output 182 to switch when the difference between input 112 and input 114 is within the hysteresis band, oscillation in output 182 is reduced.

Figure 3A:
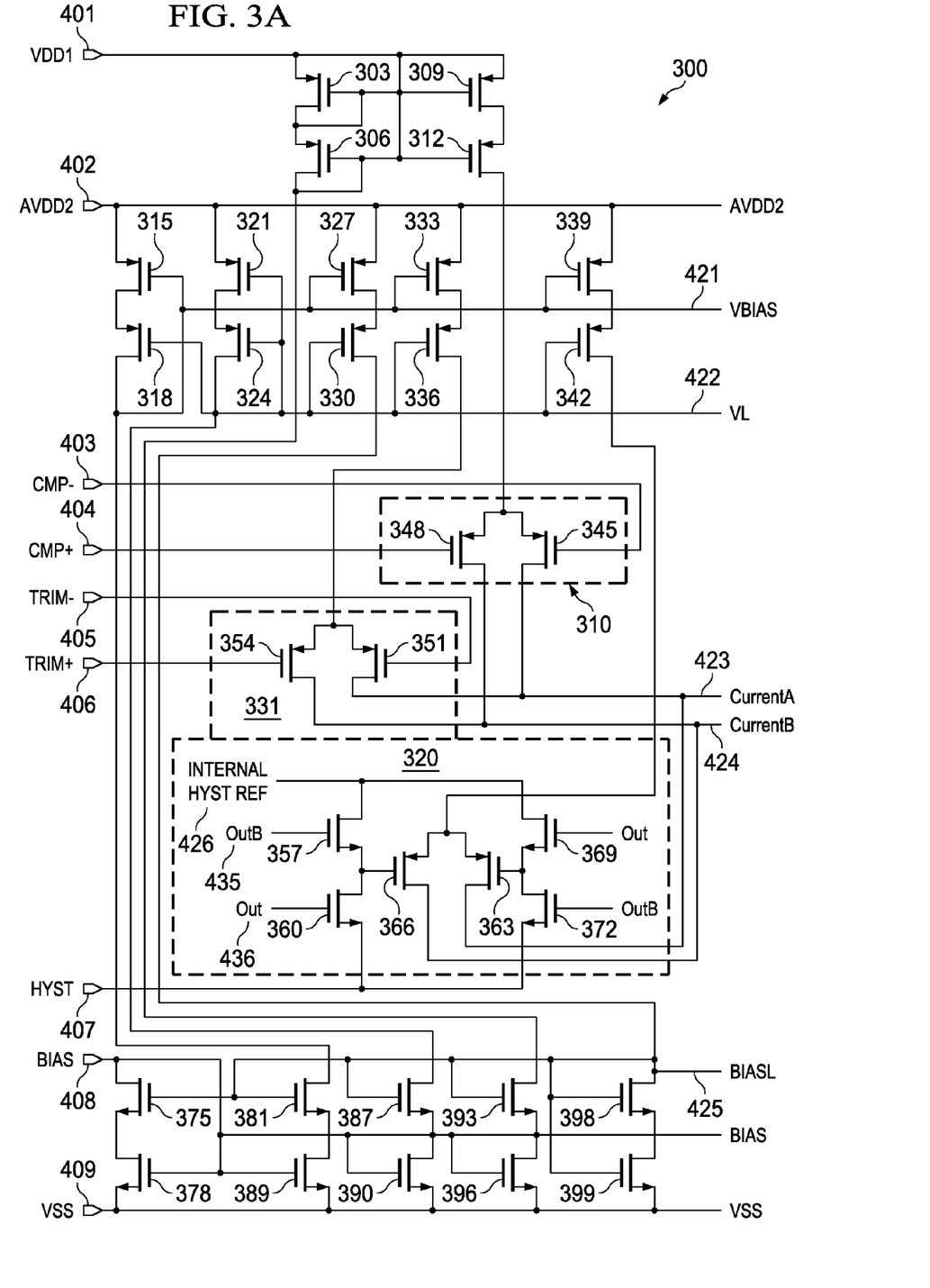
FIGS. 3a-3b are detailed schematics of one implementation of the single input hysteresis controlled comparator in accordance with various embodiments of the present invention.
Figure 3B:
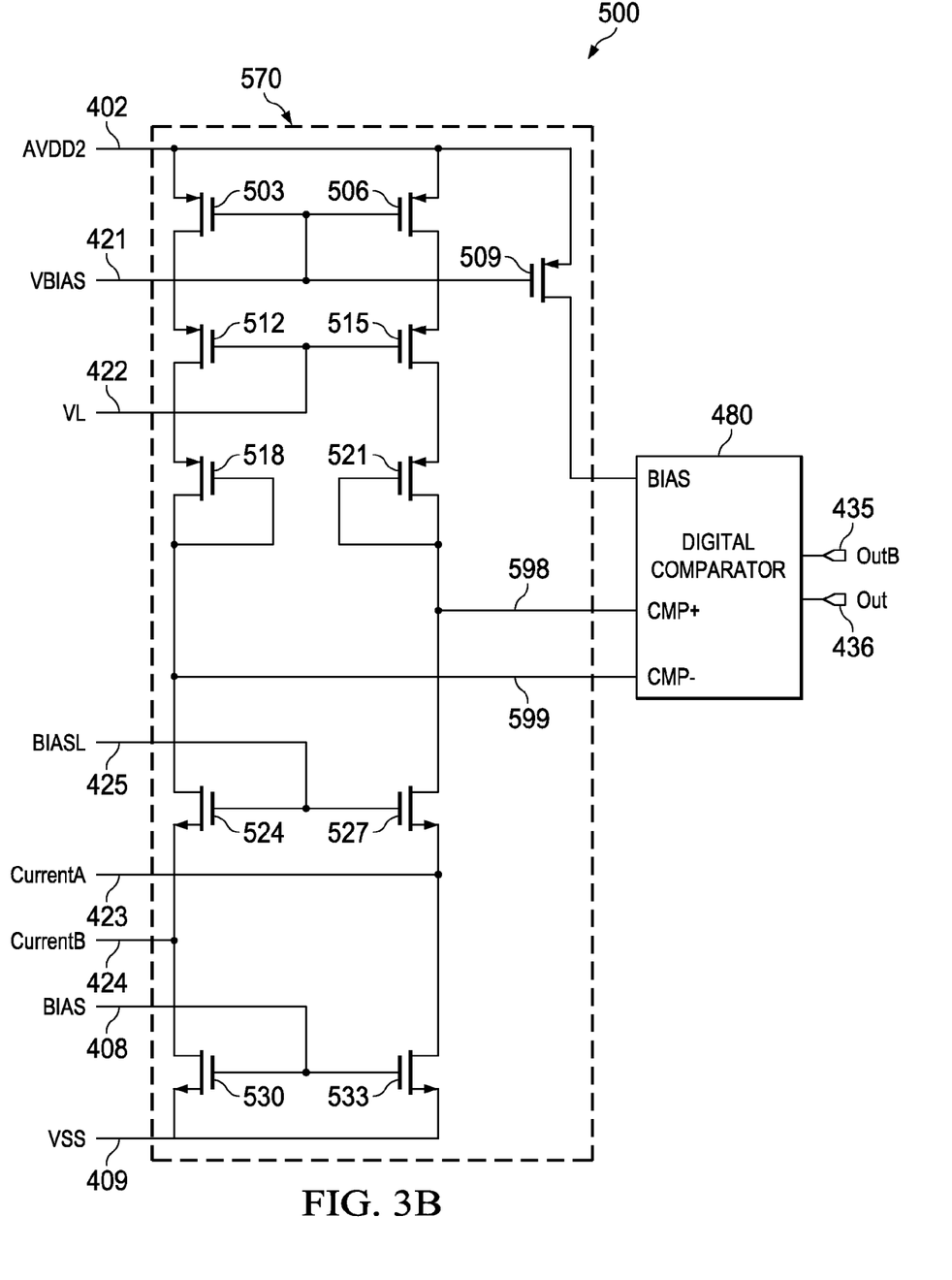

Turning to FIG. 3, detailed schematics 300, 500 of a single input hysteresis controlled comparator in accordance with some embodiments of the present invention are provided. In some cases, the circuit described in schematics 300, 500 can be used to perform various of the functions of comparator 100 of FIG. 1. Schematic 300 includes a comparator input circuit 310, a hysteresis control circuit 320, and a trim control circuit 331. In some embodiments of the present invention, comparator input circuit 310 may be used as comparator input circuit 110 of comparator 100, hysteresis control circuit 320 may be used as hysteresis control circuit 120 of comparator 100, and trim control circuit 331 may be used as trim control circuit 130 of comparator 100. Further, the remaining circuitry of schematic 300 may be used as bias circuit 150 of comparator 100. Schematic 500 includes an output buffer circuit 570 and a digital comparator 480. In some embodiments of the present invention, output buffer circuit 570 may be used as output buffer circuit 170 of comparator 100.

The bias circuit includes a number of transistors 303, 306, 309, 312, 315, 318, 321, 324, 327, 330, 333, 336, 339, 342, 375, 378, 381, 384, 387, 390, 393, 396, 398, 399 that are electrically connected such that the bias circuit provides tail currents for comparator input circuit 310, hysteresis control circuit 320, and trim control circuit 331. The bias circuit is powered by a relatively high voltage VDD1 401 and a lower voltage, AVDD2 402. In addition, the bias circuit is electrically coupled to a bias input 425 and a ground, VSS 409. The outputs of the bias circuit are a VBIAS 421 voltage level, a VL 422 voltage level, and a BIASL 425 voltage level. Each of these outputs are used in output buffer circuit 570.

Transistor 303, transistor 306, transistor 309 and transistor 312 are interconnected as shown to produce a tail current for comparator input circuit 310. A relatively large tail current is used for comparator input circuit 310 so that a large input range between voltage input 403 and voltage input 404 can be supported. To produce this substantial tail current, the aforementioned transistors are electrically coupled to a relatively high voltage supply, VDD1 401. In one particular embodiment of the present invention, VDD1 401 is a twelve volt supply and the supported range between voltage input 403 and voltage input 404 is −0.4V to 3.7V.

Transistor 333 and transistor 336 are interconnected as shown to produce a tail current for trim control circuit 331. The range of the difference between the trim inputs (405, 406) may be substantially less than that of comparator inputs 403, 404, and thus the aforementioned transistors are electrically coupled to a lower level power source, AVDD2 402. In some embodiments of the present invention, AVDD2 is a three volt power supply. Transistor 339 and transistor 342 are interconnected as shown to produce a tail current for hysteresis control circuit 320. The supported hysteresis range dictated by HYST input 407 may be substantially less than that of the comparison inputs, and thus the aforementioned transistors are electrically coupled to AVDD2 402. In one particular embodiment of the present invention, HYST input 407 varies between zero and five hundred, ten millivolts.

Comparator input circuit 310 includes two P-type transistors 345, 348 connected to operate as a differential input. The source of P-type transistor 345 is electrically coupled to the source of P-type transistor 348, and the two sources are electrically coupled to the drain of transistor 312 from which a tail current from the bias circuit is received. The gate of P-type transistor 348 is electrically coupled to voltage input 404 (CMP+), and the gate of P-type transistor 345 is electrically coupled to voltage input 403 (CMP−). The difference between voltage input 403 and voltage input 404 causes a differential current to be produced between the drain of transistor 345 and the drain of transistor 348. In particular, the tail current from transistor 312 is divided between transistor 345 and transistor 348 based on the difference between voltage input 403 and voltage input 404.

Trim circuit 331 includes two P-type transistors 351, 354 connected to operate as a differential input. The source of P-type transistor 351 is electrically coupled to the source of P-type transistor 354, and the two sources are electrically coupled to the drain of transistor 336 from which a tail current from the bias circuit is received. The gate of P-type transistor 351 is electrically coupled to a voltage input 405 (TRIM−), and the gate of P-type transistor 354 is electrically coupled to a voltage input 406 (TRIM+). The difference between voltage input 405 and voltage input 406 causes a differential current to be produced between the drain of transistor 351 and the drain of transistor 354. In particular, the tail current from transistor 336 is divided between transistor 351 and transistor 354 based on the difference between voltage input 405 and voltage input 406. Trim circuit 331 provides a programmable input that allows for matching the differential pairs of comparator input circuit 310, trim circuit 331 and hysteresis control circuit 320 so that constant hysteresis may be maintained across a large range of voltage inputs 403, 404.

Hysteresis control circuit 320 includes two P-type transistors 363, 366 connected to operate as a differential input. The source of P-type transistor 363 is electrically coupled to the source of P-type transistor 366, and the two sources are electrically coupled to the drain of transistor 342 from which a tail current from the bias circuit is received. The gate of P-type transistor 366 is electrically coupled to a hysteresis adjusted input circuit that consists of two N-type transistors 357, 360 arranged as a transistor chain. The drain of transistor 357 is electrically coupled to an internal hysteresis reference 426. Internal hysteresis reference 426 provides a reference for hysteresis input 407. In some embodiments of the present invention, internal hysteresis reference 426 is a Kelvin grounded signal on the same substrate as transistors 357, 360, 363, 366, 369, 372. The gate of transistor 357 is electrically coupled to a non-inverted output 435 from digital comparator 480. The source of transistor 357 is electrically coupled to the drain of transistor 360, and the gate of transistor 360 is electrically coupled to an inverted output 436 from digital comparator 480. The source of transistor 360 is electrically coupled to hysteresis input 407.

Similarly, the gate of P-type transistor 363 is electrically coupled to another hysteresis adjusted input circuit that consists of two N-type transistors 369, 372 arranged as a transistor chain. The drain of transistor 369 is electrically coupled to internal hysteresis reference 426. The gate of transistor 369 is electrically coupled to inverted output 436 from digital comparator 480. The source of transistor 369 is electrically coupled to the drain of transistor 372, and the gate of transistor 372 is electrically coupled to non-inverted output 435 from digital comparator 480. The source of transistor 372 is electrically coupled to hysteresis input 407.

In operation, hysteresis control circuit 120 receives the current status of the output of digital comparator 180, and based on that status, the tail current received from the bias circuit via the drain of transistor 342 is divided between transistor 363 and transistor 366. When the output of digital comparator 480 is asserted high (i.e., non-inverted output 435=1 and inverted output 436=0), the gate of transistor 366 is biased near internal hysteresis reference 426, and the gate of transistor 363 is biased near hysteresis input 407. In contrast, when the output of digital comparator 480 is asserted low (i.e., non-inverted output 435=0 and inverted output 436=1), the gate of transistor 366 is biased near hysteresis input 407, and the gate of transistor 363 is biased near internal hysteresis reference 426. Thus, when the output of digital comparator 480 is asserted at one level, a differential current is produced by dividing the tail current from the drain of transistor 342 between transistor 363 and transistor 366. When the output of digital comparator 480 is asserted at the opposite level, the opposite differential current is produced by dividing the tail current from the drain of transistor 342 between transistor 363 and transistor 366. This differential current, when summed with the other differential currents as discussed below, provides the hysteresis band discussed in relation to FIG. 2 above.

Each of the aforementioned differential currents are summed together by electrically coupling the differential currents together. In particular, the drain of transistor 351 (providing the first leg of the differential current from trim control circuit 331) is electrically coupled to the drain of transistor 345 (providing the first leg of the differential current from hysteresis control circuit 320) and the drain of transistor 363 (providing the first leg of the differential current from comparator input circuit 310). Together, a current A 423 is created. Similarly, the drain of transistor 354 is electrically coupled to the drain of transistor 348 and the drain of transistor 366. Together, a current B 424 is created.

Current A 423 and current B 424 are provided to output buffer circuit 570. Output buffer 570 is a folded cascade stage formed of transistors 503, 506, 509, 512, 515, 518, 521, 524, 527, 530, 533. Output buffer 570 converts current A 423 and current B 424 into a corresponding differential voltage (i.e., voltage input 598 and voltage input 599) that is compatible with the inputs of digital comparator 480. Digital comparator 480 is also driven by a bias signal to adjust the sensitivity of digital comparator 480.

It should be noted that input transistors 351, 354 of trim control circuit 331 and input transistors 345, 348 of comparator input circuit 310, and input transistors 363, 366 of hysteresis control circuit 320 may be N-type transistors instead of the P-type transistors that are shown. In such a case, the currents could be combined together in a PMOS load. As is known in the art, such a change may affect various voltage levels.

In conclusion, the present invention provides novel systems, devices, methods for applying programmable hysteresis in a comparator. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A programmable hysteresis comparator circuit, the circuit comprising:
    a comparator output;
    a comparator input circuit, wherein the comparator input circuit is operable to receive a first voltage input and a second voltage input, and to provide a first differential current output based at least in part on a difference between the first voltage input and the second voltage input;
    a hysteresis control circuit, wherein the hysteresis control circuit is operable to receive a single programmable voltage input, and to provide a second differential current output based at least in part on the comparator output and the single programmable voltage input;
    an output circuit, wherein the output circuit sums the first differential current and the second differential current, and provides the comparator output based at least in part on the sum of the first differential current and the second differential circuit;
    a trim control circuit, wherein the trim control circuit is operable to receive a programmable trim input, and to provide a third differential current output based at least in part on the programmable trim input; and
    wherein the output circuit is further operable to sum the third differential current with the first differential current and the second differential current, and wherein the comparator output is based at least in part on the sum of the first differential current, the second differential current, and the third differential current.

2. The circuit of claim 1, wherein the single programmable voltage input is referenced to a Kelvin connected ground.

3. The circuit of claim 2, wherein the Kelvin connected ground is done on the same substrate as the hysteresis control circuit.

4. The circuit of claim 1, wherein the output circuit comprises:
    a digital comparator circuit, wherein the digital comparator circuit:
        receives at a first input the sum of a first leg of the first differential current, a first leg of the second differential current, and a first leg of the third differential current;
        receives at a second input the sum of a second leg of the first differential current, a second leg of the second differential current, and first leg of the third differential current;
        provides the comparator output.

5. The circuit of claim 1, wherein the comparator input circuit includes a first P-type transistor and a second P-type transistor, wherein the source of the first P-type transistor is electrically coupled to the source of the second P-type transistor, wherein the gate of the first P-type transistor is electrically coupled to the first voltage input, and wherein the gate of the second P-type transistor is electrically coupled to the second voltage input.

6. The circuit of claim 5, wherein the hysteresis control circuit includes:
   a first transistor chain and a second transistor chain;
      wherein the first transistor chain includes a first N-type transistor and a second N-type transistor, wherein the drain of the first N-type transistor is electrically coupled to a Kelvin connected ground, wherein the source of the first N-type transistor is electrically coupled to the drain of the second N-type transistor, wherein the source of the second N-type transistor is electrically coupled to the single programmable voltage input, and wherein a first output node is electrically coupled to the source of the first N-type transistor and the drain of the second N-type transistor;
      wherein the second transistor chain includes a third N-type transistor and a fourth N-type transistor, wherein the drain of the third N-type transistor is electrically coupled to the Kelvin connected ground, wherein the source of the third N-type transistor is electrically coupled to the drain of the fourth N-type transistor, wherein the source of the fourth N-type transistor is electrically coupled to the single programmable voltage input, and wherein a second output node is electrically coupled to the source of the third N-type transistor and the drain of the fourth N-type transistor;
      wherein the gate of the first N-type transistor and the gate of the fourth N-type transistor are electrically coupled to the comparator output; and
      wherein the gate of the second N-type transistor and the gate of the third N-type transistor are electrically coupled to an inverted version of the comparator output; and
   a third P-type transistor and a fourth P-type transistor, wherein the source of the third P-type transistor is electrically coupled to the source of the fourth P-type transistor, wherein the gate of the third P-type transistor is electrically coupled to the first output node, and wherein the gate of the fourth P-type transistor is electrically coupled to the second output node.

7. The circuit of claim 6, wherein the drain of the first P-type transistor provides a first leg of the first differential current, wherein the drain of the second P-type transistor provides a second leg of the first differential current, wherein the drain of the third P-type transistor provides a first leg of the second differential current, and wherein the drain of the fourth P-type transistor provides a second leg of the second differential current; and
   wherein summing the first differential current and the second differential current includes electrically coupling the first leg of the first differential current to the first leg of the second differential current, and electrically coupling the second leg of the first differential current to the second leg of the second differential current.

8. The circuit of claim 7, wherein the circuit further comprises:
   a trim control circuit, wherein the trim control circuit is operable to receive a first programmable trim input and a second programmable trim input, and to provide a third differential current output based at least in part on the first programmable trim input and the second programmable trim input;
   wherein the trim control circuit includes a fifth P-type transistor and a sixth P-type transistor, wherein the source of the fifth P-type transistor is electrically coupled to the source of the sixth P-type transistor, wherein the gate of the fifth P-type transistor is electrically coupled to the first programmable trim input, wherein the gate of the sixth P-type transistor is electrically coupled to the second programmable trim input, wherein the drain of the fifth P-type transistor provides a first leg of the third differential current, and wherein the drain of the sixth P-type transistor provides a second leg of the third differential current;
   wherein the output circuit is further operable to sum the third differential current with the first differential current and the second differential current, and wherein the comparator output is based at least in part on the sum of the first differential current, the second differential current, and the third differential current; and
   wherein summing the third differential current with the first differential current and the second differential current includes electrically coupling the first leg of the third differential current to the electrically coupled first legs of the first differential current and the second differential current, and electrically coupling the second leg of the third differential current to the electrically coupled second legs of the first differential current and the second differential current.

9. A method for reducing oscillation in a comparator, the method comprising:
   providing a comparator circuit, wherein the comparator circuit includes:
      a comparator output;
      a comparator input circuit, wherein the comparator input circuit is operable to receive a first voltage input and a second voltage input, and to provide a first differential current output based at least in part on a difference between the first voltage input and the second voltage input;
      a hysteresis control circuit, wherein the hysteresis control circuit is operable to receive a single programmable voltage input, and to provide a second differential current output based at least in part on the comparator output and the single programmable voltage input; and
      an output circuit, wherein the output circuit sums the first differential current and the second differential current, and provides the comparator output based at least in part on the sum of the first differential current and the second differential current; and
   applying a first voltage to the first voltage input and a second voltage to the second voltage input, wherein the first voltage is greater than the second voltage by at least a second amount;
   applying a third voltage to the single programmable voltage input;
   in a first step, modifying the first voltage in relation to the second voltage, wherein the first voltage becomes less than the second voltage by a first amount, and wherein the comparator output does not change; and
   in a second step subsequent to the first step, modifying the first voltage in relation to the second voltage, wherein the first voltage becomes less than the second voltage by the second amount, wherein the second amount is greater than the first amount, and wherein the comparator output changes.

10. The method of claim 9, wherein the single programmable voltage input is referenced to a Kelvin connected ground.

11. The method of claim 10, wherein the Kelvin connected ground is done on the same substrate as the hysteresis control circuit.

12. The method of claim 9, wherein the first amount is less than a hysteresis offset generated in response to applying the third voltage.

13. The method of claim 9, wherein the second amount is greater than a hysteresis offset generated in response to applying the third voltage.

14. The method of claim 9, wherein the method further comprises:
in a third step subsequent to the second step, modifying the first voltage in relation to the second voltage, wherein the first voltage becomes greater than the second voltage by the first amount, and wherein the comparator output does not change; and
in a fourth step subsequent to the third step, modifying the first voltage in relation to the second voltage, wherein the first voltage becomes greater than the second voltage by the second amount, and wherein the comparator output changes.

15. The method of claim 14, wherein the first amount is less than a hysteresis offset generated in response to applying the third voltage, and wherein the second amount is greater than the hysteresis offset generated in response to applying the third voltage.

16. A comparator circuit with programmable hysteresis and trim, the circuit comprising:
a comparator output;
a comparator input circuit, wherein the comparator input circuit is operable to receive a first voltage input and a second voltage input, and to provide a first differential current output based at least in part on a difference between the first voltage and the second voltage input;
a hysteresis control circuit, wherein the hysteresis control circuit is operable to receive a single programmable voltage input, and to provide a second differential current output based at least in part on the comparator output and the single programmable voltage input; and wherein the single programmable voltage input is referenced to a Kelvin connected ground;
a trim control circuit, wherein the trim control circuit is operable to receive a first programmable trim input and a second programmable trim input, and to provide a third differential current output based at least in part on the first and second programmable trim inputs; and
an output circuit, wherein the output circuit sums the first differential current, the second differential current, and the third differential current; and provides the comparator output based at least in part on the sum of the first differential current, the second differential current, and the third differential current.

17. The circuit of claim 16, wherein the output circuit comprises:
a digital comparator circuit, wherein the digital comparator circuit:
receives at a first input the sum of the first leg of a first differential current, a first leg of the second differential current, and the first leg of the third differential current;
receives at a second input the sum of a second leg of the first differential current, a second leg of the second differential current, and a second leg of the third differential current; and provides the comparator output.

18. The circuit of claim 17:
wherein the comparator input circuit includes a first P-type transistor and a second P-type transistor, wherein the source of the first P-type transistor is electrically coupled to the source of the second P-type transistor, wherein the gate of the first P-type transistor is electrically coupled to the first voltage input, and wherein the gate of the second P-type transistor is electrically coupled to the second voltage input; and
wherein the hysteresis control circuit includes:
a first transistor chain and a second transistor chain;
wherein the first transistor chain includes a first N-type transistor and a second N-type transistor, wherein the drain of the first N-type transistor is electrically coupled to a Kelvin connected ground, wherein the source of the first N-type transistor is electrically coupled to the drain of the second N-type transistor, wherein the source of the second N-type transistor is electrically coupled to the single programmable voltage input, and wherein a first output node is electrically coupled to the source of the first N-type transistor and the drain of the second N-type transistor;
wherein the second transistor chain includes a third N-type transistor and a fourth N-type transistor, wherein the drain of the third N-type transistor is electrically coupled to the Kelvin connected ground, wherein the source of the third N-type transistor is electrically coupled to the drain of the fourth N-type transistor, wherein the source of the fourth N-type transistor is electrically coupled to the single programmable voltage input, and wherein a second output node is electrically coupled to the source of the third N-type transistor and the drain of the fourth N-type transistor;
wherein the gate of the first N-type transistor and the gate of the fourth N-type transistor are electrically coupled to the comparator output; and
wherein the gate of the second N-type transistor and the gate of the third N-type transistor are electrically coupled to an inverted version of the comparator output; and
a third P-type transistor and a fourth P-type transistor, wherein the source of the third P-type transistor is electrically coupled to the source of the fourth P-type transistor, wherein the gate of the third P-type transistor is electrically coupled to the first output node, and wherein the gate of the fourth P-type transistor is electrically coupled to the second output node; and
wherein the trim control circuit includes a fifth P-type transistor and a sixth P-type transistor, wherein the source of the fifth P-type transistor is electrically coupled to the source of the sixth P-type transistor, wherein the gate of the fifth P-type transistor is electrically coupled to the first programmable trim input, wherein the gate of the sixth P-type transistor is electrically coupled to the second programmable trim input, wherein the drain of the fifth P-type transistor provides a first leg of the third differential current, and wherein the drain of the sixth P-type transistor provides a second leg of the third differential current.

19. The circuit of claim 18, wherein summing the first differential current, the second differential current and the third differential current includes electrically coupling the first leg of the first differential current to the first leg of the second differential current and to the first leg of the third differential current, and electrically coupling the second leg of the first differential current to the second leg of the second differential current and to the second leg of the second differential current.

* * * * *